United States Patent [19]

Sato et al.

[11] Patent Number: 4,835,587
[45] Date of Patent: May 30, 1989

[54] SEMICONDUCTOR DEVICE FOR DETECTING RADIATION

[75] Inventors: Noritada Sato; Yasukazu Seki, both of Yokosuka, Japan

[73] Assignee: Fuji Electric Co., Ltd., Kawasaki, Japan

[21] Appl. No.: 103,917

[22] Filed: Oct. 1, 1987

Related U.S. Application Data

[60] Continuation-in-part of Ser. No. 698,616, Feb. 6, 1985, which is a division of Ser. No. 528,077, Aug. 13, 1983, abandoned, and Ser. No. 771,622, Sep. 3, 1985, Pat. No. 4,689,649.

[30] Foreign Application Priority Data

Oct. 3, 1986 [JP] Japan .................................. 61-235541

[51] Int. Cl.$^4$ .............................................. H01L 27/14
[52] U.S. Cl. ........................................ 357/29; 357/30; 357/52; 250/270
[58] Field of Search ............... 357/30 P, 30 H, 30 D, 357/30 R, 30 A, 30 I, 52, 52 D, 29; 250/270

[56] References Cited

U.S. PATENT DOCUMENTS

| | | | |
|---|---|---|---|
| 3,472,711 | 10/1969 | Chow | 357/29 |
| 3,601,668 | 8/1971 | Slaten | 357/52 X |
| 3,646,527 | 2/1972 | Wada et al. | 357/14 X |
| 3,812,518 | 5/1974 | Kurz et al. | 357/30 D |
| 4,090,213 | 5/1978 | Maserijian | 357/30 |
| 4,160,985 | 7/1979 | Kamins et al. | 357/30 D |
| 4,343,962 | 8/1982 | Neugroschel | 357/30 |
| 4,524,376 | 5/1982 | Cornick | 357/55 |

FOREIGN PATENT DOCUMENTS

| | | | |
|---|---|---|---|
| 3431053 | 3/1985 | Fed. Rep. of Germany | 357/14 |
| 53-136987 | 11/1978 | Japan . | |
| 61-74375 | 4/1986 | Japan . | |
| 2104725 | 3/1983 | United Kingdom | 357/14 |

Primary Examiner—Andrew J. James
Assistant Examiner—William A. Mintel
Attorney, Agent, or Firm—Brumbaugh, Graves, Donohue & Raymond

[57] ABSTRACT

A semiconductor device for detecting gamma radiation displaying superior linearity of response to radiation without showing any energy dependency even if the gamma rays have the high energy is formed using an annular depletion region surrounded by non-depletion regions. The size of the regions is selected so that the distance from the edge of the depletion to the most distant point of the non-depletion region is at least about equal to the mean range of the highest energy gamma ray to be measured.

7 Claims, 2 Drawing Sheets

SEMICONDUCTOR DEVICE FOR DETECTING RADIATION

This application is a continuation-in-part of copending U.S. patent application Ser. No. 698,616 filed Feb. 6, 1985 which is a divisional of Ser. No. 528,077 filed Aug. 13, 1983, now abandoned and Ser. No. 771,622 filed Sept. 3, 1985, now U.S. Pat. No. 4,689,649, issued Aug. 25, 1987.

BACKGROUND OF THE INVENTION

This invention relates to a semiconductor device for detecting and counting gamma rays, and particularly to a semiconductor device for detecting gamma rays wherein the measured count of gamma rays of various energies has improved linearity.

Traditionally, Geiger-Müller counters have been used to detect and quantify gamma rays as well as other types of ionizing radiation. However, the life of these counters is too short, and the linearity of the gamma count with respect to the dose rate is not sufficient. Moreover, a high voltage power supply is needed in such a device.

Therefore, a semiconductor device for detecting gamma radiation has been recently developed. In such a semiconductor device for detecting gamma radiation, a high resistivity material is used, for example, germanium (Ge) or silicon (Si) diffused with lithium (Li). This allows the formation of a depletion layer with respect to gamma rays in the semiconductor material. When gamma rays pass through this depletion layer, secondary electrons are generated by either photoelectric effect, Compton effect, or as a result of the creation of a electron-hole pairs. These secondary electrons then act on grid atoms, and create the electron-hole pairs which are detected as electric pulses. The dosage of gamma rays can be measured by way of counting the number of the electric pulses.

The original function of gamma ray counters was to count the number of gamma rays. The conventional semiconductor device for detecting the radiation suffers from a problem, however, because the number of pulses produced varies according the level of energy of the gamma rays even in the same dose field. The reason for this can be understood from a theoretical consideration of the known device.

The principle of the operation of the known semiconductor device for detecting the radiation is shown in FIG. 1. In the device, an N-type layer 2 is provided in a P-type silicon substrate 1, for example by a diffusion method, to form a PN junction. A reverse bias voltage $V_B$ is applied to the PN junction through electrodes 3 and 4 disposed on two sides of the P-type silicon substrate 1, whereby a depletion layer 5 is formed within the substrate adjacent to the N-type layer. Secondary electrons 7 are formed by one of three processes, a photoelectric effect A, Compton effect B, or creation of electron-hole pairs C when gamma rays 6 which are incident upon the device pass through the depletion layer 5. The secondary electrons 7 then act on grid atoms, as a result of which electron-hole pairs 8, which are detected as electric pulses 9, are created. The number of these electric pulses 9 is counted by a counter 10 having an amplifier. A portion of the gamma rays are not counted, for example as a result of scattering or penetration (gamma ray 11) through the depletion layer 5.

In this device, the number of pulses per unit dosage, namely the count C of the gamma rays, is expressed by the following formula (1).

$$C = K \frac{\mu_{Si} l}{\mu_{air} E} S \qquad (1)$$

where:
K: constant
$\mu_{Si}$: absorption coefficient of radiation detecting device
$\mu_{air}$: absorption coefficient of air
l: thickness of depletion layer
S: area of depletion layer
E: energy of gamma rays As is evident from the formula (1), the value of C is inversely dependent upon E when the thickness l of the depletion layer 5, and the area S of the depletion layer 5 along the surface of the silicon substrate 1 are constant. That is, the count C becomes small when the energy of the gamma rays is large. This leads to a reduction in sensitivity for high energy gamma rays, and a deterioration in the quality of radiation measurement.

A semiconductor device for detecting radiation which overcomes the aforesaid problem is shown in Japanese Patent Laid-Open No. 74375/1986, wherein the linearity of the response to variable energy radiation is somewhat improved. The radiation detecting device disclosed in this publication its characterized in that the semiconductor material extends beyond the depletion layer, such that a portion of the gamma rays are incident on this non-depletion region. Secondary electrons which are generated by gamma rays incident upon non-depletion region surrounding the depletion layer, may migrate to the depletion layer and contribute to the signal produced if the mean range of the electron is sufficient to reach the depletion layer from the site of formation.

SUMMARY OF THE INVENTION

The present invention incorporates an annular depletion region and at least two non-depletion regions on the upper surface of a semiconductor radiation detector. In an embodiment having two non-depletion regions, one of the non-depletion regions is disposed inside, i.e., surrounded by, the depletion region, while the other one is disposed outside the depletion region. The distance between each point on the edges of the depletion region and the farthest part of the non-depletion regions is preferably at least substantially the same as the mean range of secondary electrons which are generated by gamma rays having the maximum energy of the gamma rays to be detected. The utilization of both the inside space and the outside space of the depletion region facilitates the desired linear response to gamma rays over a broad range of energies.

BRIEF DESCRIPTION OF THE DRAWINGS

FIG. 2 illustrates a movement of secondary electrons from a non-depletion region of a semiconductor device for detecting radiation, in which FIG. 2(a) is a cross-sectional view and FIG. 2(b) is a plan view.

DETAILED DESCRIPTION OF THE INVENTION

The principle of the present invention will now be described with reference to FIGS. 2-7.

Figure 2:
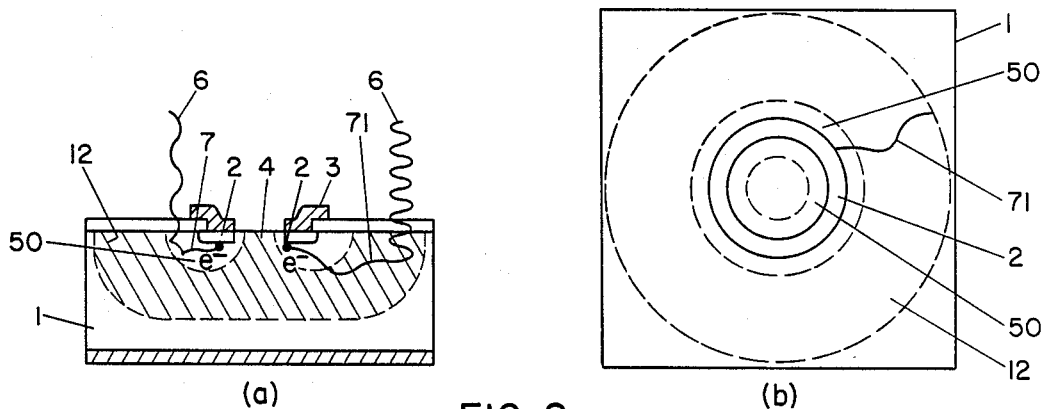

As shown in FIG. 2, not only secondary electrons 7 generated in a depletion region 50, but also secondary electrons 71 which are generated in a non-depletion region 12 adjacent to the depletion region 50 and which migrate to reach the depletion region 50 contribute to the creation of electron-hole pairs. That is, a non-depletion region 12 adjacent to the depletion region 50, the non-depletion region being shown as a hatched section, will contribute to count the gamma rays. The effective width of non-depletion region 12 is narrow if the mean range of the secondary electrons is short, i.e. when the energy of the gamma ray 6 which is incident upon the detector is small, and is wide if the mean range of the secondary electrons is long, i.e., when the energy of the incident gamma ray is large.

The effect of this phenomenon on the count of gamma rays can be clearly seen by way of transforming the formula (1) to formula (2).

$$C = K \frac{\mu_{Si} l}{\mu_{air} E} (S_1 + S_2) \quad (2)$$

wherein:

K: constant $\mu_{Si}$: absorption coefficient of radiation detecting device $\mu_{air}$: absorption coefficient of air l: thickness of depletion layer $S_1$: area of depletion layer $S_2$: effective area of the non-depletion regions In this formula (2), the area of the non-depletion region 12 in which the formation of secondary electrons can lead to electrical pulses, i.e., the effective area of the non-depletion region, is represented by $S_2$ while the area of the depletion region is represented by $S_1$. In the circumstance where $S_2 << S_1$, the area which contributes to generate the secondary electrons is substantially constant even if the energy of the gamma rays is varied. However, when $S_1 \leq S_2$, the number of secondary electrons which will contribute to create the electron pairs varies depending upon the mean range of the secondary electrons.

Table 1 shows the relationship between the energy E of the gamma rays, the mean range of the secondary electrons, the absorption coefficient of air, $\mu_{air}$, and the absorption coefficient of the device for detecting radiation, $\mu_{Si}$.

TABLE 1

| Energy Of Gamma Rays (MeV) | Mean range Of Secondary Electrons (μm) | Absorption Coefficient Of Air (× $10^{-4}$ cm$^{-1}$) | Absorption Coefficient of Si (cm$^{-1}$) |
| --- | --- | --- | --- |
| 0.1 | 20 | 0.279 | 0.44 |
| 0.2 | 30 | 0.324 | 0.30 |
| 0.35 | 42 | 0.356 | 0.24 |
| 0.66 | 170 | 0.356 | 0.18 |
| 1.25 | 500 | 0.336 | 0.14 |
| 2.0 | 1170 | 0.286 | 0.11 |

TABLE 1-continued

| Energy Of Gamma Rays (MeV) | Mean range Of Secondary Electrons (μm) | Absorption Coefficient Of Air (× $10^{-4}$ cm$^{-1}$) | Absorption Coefficient of Si (cm$^{-1}$) |
| --- | --- | --- | --- |
| 4.0 | 2800 | 0.233 | 0.078 |
| 6.0 | 4600 | 0.209 | 0.067 |

When the area of the non-depletion region, $S_2$, is large enough, the number of the secondary electrons which will contribute to the creation of the electron pairs varies in accordance with the energy E, of the gamma rays. Thus, the total collection area, $(S_1+S_2)$, increases with the energy of the gamma rays increases. At the same time, the increase of E reduces the term $\mu_{Si}/(\mu_{air}E)$. Accordingly, the energy dependency of the count C of the gamma rays becomes smaller, whereby the linearity of the response is improved. For maximum effectiveness, the area $S_2$ of non-depletion regions is such that the secondary electrons reach the depletion layer on both the inside and outside edges of the depletion layer. Therefore, each of (1) the distance between the circumferential portion of the semiconductor substrate 1 and the outer edge portion of the depletion layer, and (2) the maximum distance between a point in the inner non-depletion layer and the inner edge of the depletion layer are preferably substantially equal to the mean range of secondary electrons which are generated by gamma rays having the maximum energy of the gamma rays to be detected. That is, in order to obtain superior characteristics of quality of a radiation with respect to the gamma rays in the level of 0.1 to 6.0 MeV, non-depletion regions of more than about 4600 μm in width are respectively required on the inside and outside of the depletion layer.

Figure 1:
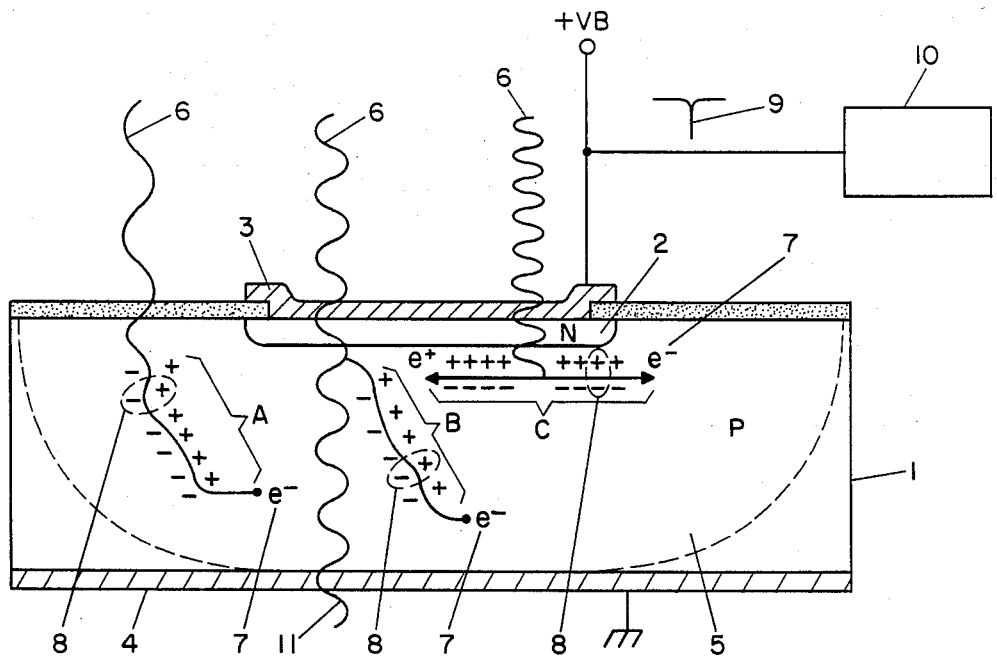
FIG. 1 is a cross-sectional view illustrating the principle of the operation of a semiconductor device for detecting radiation.
Figure 3:
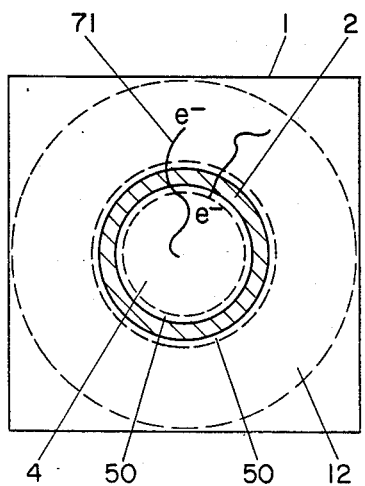
FIG. 3 is a plan view illustrating an embodiment of the present invention.

FIG. 3 illustrates an embodiment of the present invention, in which an annular N-type region 2 of 4.6 mm of inner diameter, and 0.2 mm in width is formed at the center portion of a P-type silicon substrate 1 in the form of a 12.9 mm × 12.9 mm square. In a completed device, electrodes (not shown) would be included in a manner analogous to that shown in FIG. 1. As a result of the measurements of this device, secondary electrons 71 which are generated in the inner non-depletion region 4 and the outer non-depletion region 12 by gamma rays having a maximum energy of 6 MeV penetrate the depletion layer 5 surrounding the N-region 2 at a high rate. This penetration will contribute to the creation of electron-hole pairs in the depletion region 5, and reduces the energy dependency of the sensitivity of the radiation detecting device.

Figure 4:
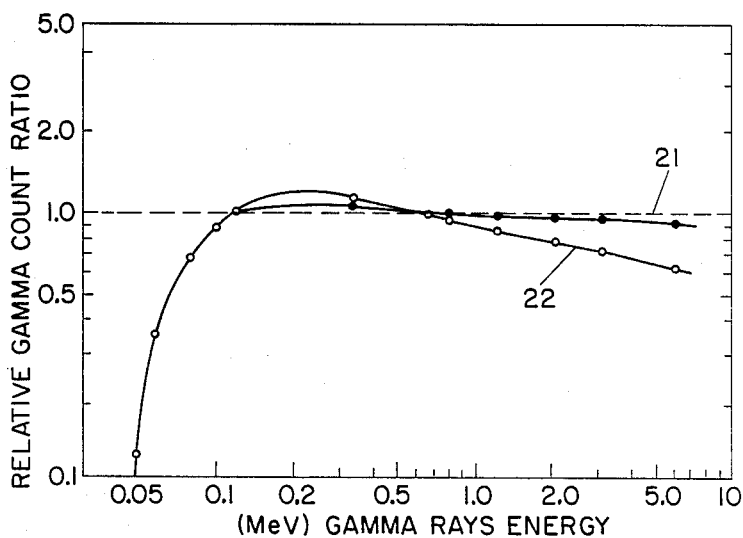
FIG. 4 is a graph showing radiation quality characteristics of a detecting device shown in FIG. 3 and that of a conventional detecting device.

The linearity of a device as shown in FIG. 3 is superior to that achieved by the device described in the aforesaid publication, in which the distances between the end portion of the depletion layer and the end portions of the opposing non-depletion layers are more than 4600 μm, respectively, but which lacks an inner non-depletion region 4. The curve 21 shown in FIG. 4 illustrates the relationship between the relative count ratio of gamma rays which is obtained using a detector according to the present invention and the energy of the gamma rays. The curve 22 shows the result obtained by means of a detecting device in which a circular N-type region of a diameter of 1.96 mm is formed so as to form a depletion region of substantially the same area as the annular depletion region of the aforesaid embodiment on a substrate of the same area. As can be clearly seen from these curves, the linearity of the response is remarkably improved in the present invention. This is achieved by respective provision of effective secondary electrons generating regions on both inside and outside of the depletion layer. As a result, the probability of the secondary electrons striking the non-depletion region and then reaching the depletion region is increased. The reason why the relative counting ratios of the gamma rays shown by the curves 21 and 22 are lowered in the region of the low energy level is that the threshold level of the electric current pulse counter is set to 0.06 MeV so as not to count the pulses of a level lower than 0.06 MeV.

The N-type region in devices according to the claimed invention need not be perfectly circular as shown in FIG. 3, but need only be substantially annular. For example, FIG. 5 illustrates another embodiment wherein the N-type region 2 is formed in a square shape.

Figure 5:
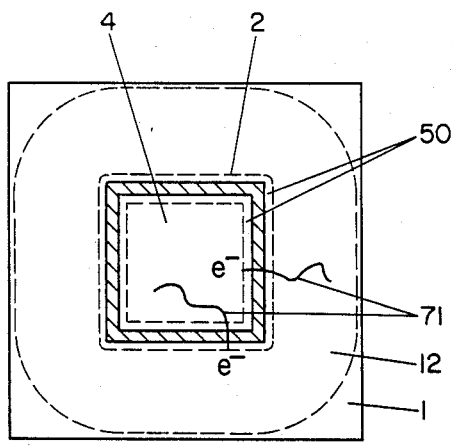
FIGS. 5, 6 and 7 respectively illustrate other embodiments of the present invention.
Figure 6:
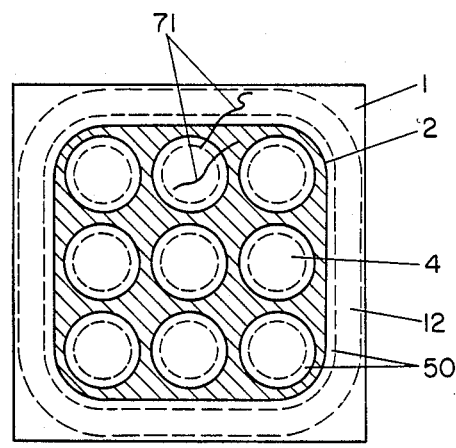
Figure 7:
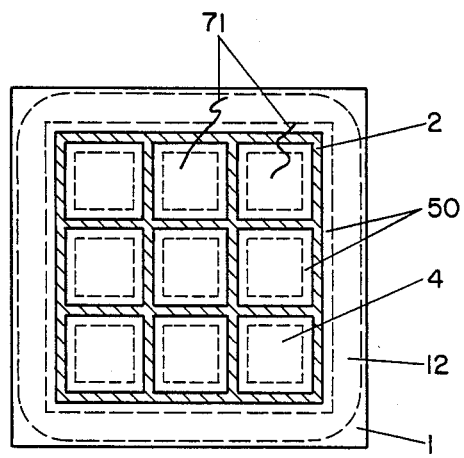

FIGS. 6 and 7 illustrate other embodiments, respectively, wherein a multiplicity of the detecting devices, shown in FIGS. 3 and 5, respectively, are combined in an array to enlarge the area of the depletion layers 50 for the purpose of making the radiation detecting device high sensitivity. In these devices, a plurality of annular regions are fused on a single substrate.

This invention is not limited to the case wherein the depletion layer is formed by PN junctions, but is, of course, capable of being applied to the case in which the depletion layer is formed by way of hetero-junction between a surface barrier or silicon layer and the amorphous silicon. Furthermore, in the similar matter as that disclosed in the aforesaid publication, a projecting portion may be provided for the depletion layer.

According to the present invention, a semiconductor device for detecting radiation as a gamma rays counter which can be used in a wide range of gamma rays energy, and displaying high reliability can be obtained. Such characteristics can be obtained by provision of the non-depletion layers which are large enough for all of the secondary electron beams which are generated by the gamma rays made upon the inside and the outside of the depletion layer formed in an annular shape to reach the depletion layer, whereby effective secondary electron generating regions which are needed to count the high energy gamma rays can be easily provided.

We claim:

1. A semiconductor device for detecting gamma radiation having a maximum energy comprising:
   (a) a semiconductor substrate having two principal surfaces;
   (b) a substantially annular region of a semiconductor material different from said substrate disposed on a first of said principal surfaces;
   (c) a first electrode disposed on said first principal surface and making electrical contact with said annular region of semiconductor material; and
   (d) a second electrode disposed on a second principal surface of the substrate; wherein application of a biasing voltage between said electrodes leads to the formation of an annular depletion region within the substrate and adjacent to said annular region of semiconductor material, said substrate and said annular region of semiconductor material of a size such that the inner diameter of the depletion region is at least substantially equal to a mean range of secondary electrons generated by incidence of said maximum energy gamma radiation on said substrate, and such that the distance from the outer edge of said annular depletion region to an edge of the substrate is at least substantially equal to said mean range.

2. A semiconductor device according to claim 1, wherein the semiconductor substrate is a P-type material and the annular region is formed from an N-type material.

3. A semiconductor device according to claim 1, comprising a plurality of substantially annular regions of semiconductor material disposed as a fused array on the substrate.

4. A semiconductor device according to claim 1, wherein the maximum energy of the gamma radiation is about 6 MeV and the inner diameter of the depletion region is about 4.6 mm.

5. A semiconductor device according to claim 2, wherein the maximum energy of the gamma radiation is about 6 MeV and the inner diameter of the depletion region is about 4.6 mm.

6. A semiconductor device according to claim 3, wherein the maximum energy of the gamma radiation is about 6 MeV and the inner diameter of the depletion region is about 4.6 mm.

7. A semiconductor device according to claim 1, wherein the semiconductor substrate and the annular region form a heterojunction.

* * * * *